United States Patent
Tsuchiya et al.

(10) Patent No.: US 9,013,026 B2
(45) Date of Patent: Apr. 21, 2015

(54) GROUP III NITRIDE SEMICONDUCTOR CRYSTAL, GROUP III NITRIDE SEMICONDUCTOR SUBSTRATE, GROUP III NITRIDE SEMICONDUCTOR FREESTANDING SUBSTRATE, NITRIDE SEMICONDUCTOR DEVICE, AND RECTIFIER DIODE

(71) Applicant: Hitachi Metals, Ltd., Tokyo (JP)

(72) Inventors: Tadayoshi Tsuchiya, Tokyo (JP); Naoki Kaneda, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/020,207

(22) Filed: Sep. 6, 2013

(65) Prior Publication Data

US 2014/0070371 A1 Mar. 13, 2014

(30) Foreign Application Priority Data

Sep. 10, 2012 (JP) ................... 2012-198472

(51) Int. Cl.
*H01L 29/20* (2006.01)
*H01L 21/02* (2006.01)
*H01L 29/66* (2006.01)
*H01L 29/872* (2006.01)

(52) U.S. Cl.
CPC ........ *H01L 29/2003* (2013.01); *H01L 21/0237* (2013.01); *H01L 21/02389* (2013.01); *H01L 21/0254* (2013.01); *H01L 21/02576* (2013.01); *H01L 21/0262* (2013.01); *H01L 29/66212* (2013.01); *H01L 29/872* (2013.01)

(58) Field of Classification Search
CPC ..................... H01L 29/2003; H01L 29/66212; H01L 29/872; H01L 21/02389
USPC ........................................................ 257/615
See application file for complete search history.

(56) References Cited

U.S. PATENT DOCUMENTS

2012/0329245 A1* 12/2012 Uematsu et al. .............. 438/460

OTHER PUBLICATIONS

High-purity GaN epitaxial layers for power devices on low-dislocation-density GaN substrates; Journal of Crystal Growth 298, p. 871-874; S. Hashimoto et al. (2007).

* cited by examiner

*Primary Examiner* — Tu-Tu Ho
(74) *Attorney, Agent, or Firm* — Paul D. Bianco; Martin Fleit; Fleit Gibbons Gutman Bongini & Bianco PL (57) ABSTRACT

There is provided a group III nitride semiconductor crystal, containing a donor-type impurity and having a hydrogen concentration of 2.0E+16 $cm^{-3}$ or less in a crystal.

8 Claims, 8 Drawing Sheets

GROUP III NITRIDE SEMICONDUCTOR CRYSTAL, GROUP III NITRIDE SEMICONDUCTOR SUBSTRATE, GROUP III NITRIDE SEMICONDUCTOR FREESTANDING SUBSTRATE, NITRIDE SEMICONDUCTOR DEVICE, AND RECTIFIER DIODE

BACKGROUND

1. Technical Field

The present application is based on Japanese Patent Application No. 2012-198472 filed on Sep. 10, 2012, the entire contents of which are hereby incorporated by reference.

The present invention relates to a group III nitride semiconductor crystal, particularly relates to the group III nitride semiconductor crystal having a low carrier concentration, and further relates to a group III nitride semiconductor substrate, a group III nitride semiconductor freestanding substrate, a nitride semiconductor device, and a rectifier diode.

2. Description of Related Art

The group III nitride semiconductor is composed of the group III nitride semiconductor crystal. For example, a gallium nitride semiconductor (GaN semiconductor), etc., is given as the group III nitride semiconductor. The GaN semiconductor has high band gap, high electron mobility, high saturation electron speed, and high breakdown field, compared with a semiconductor such as silicon. Therefore, attention is paid to the GaN semiconductor as a material for the use of a power device such as a diode and a transistor, etc.

The power device has a breakdown voltage layer, and is used for equipment of high voltage and large current. N-type group III nitride semiconductor is used for the breakdown voltage layer, and high breakdown voltage is required for the group III nitride semiconductor. Further, from a viewpoint of energy-saving and low heat generation, the group III nitride semiconductor is required to have a low electric resistance (on-resistance) in on-state, which is a low on-resistance.

The breakdown voltage and the on-resistance are determined by a carrier concentration of the group III nitride semiconductor. The breakdown voltage becomes high in a high breakdown voltage state as a carrier concentration becomes low. Meanwhile, the on-resistance becomes low in a low-on-resistance state as the carrier concentration is high. Namely, the breakdown voltage and the on-resistance are set in a relation of trade-off.

In order to obtain the high breakdown voltage and the low on-resistance in the power device, the n-type nitride semiconductor having a low carrier concentration is required as the breakdown voltage layer. For example, the carrier concentration is required to be $1.0E+16 \text{ cm}^{-3}$ or less.

The carrier concentration is controlled by the concentration of a donor-type impurity (such as Si, etc.) with which the n-type group III nitride semiconductor is doped. In then-type group III nitride semiconductor, a carrier is generated by the donor-type impurity, and therefore the carrier concentration corresponds to the concentration of the donor-type impurity. However, an acceptor-type defect is mixed into the n-type group III nitride semiconductor, and therefore the carrier concentration is reduced by a compensation of the acceptor-type defect. The compensation means the reduction of the carrier concentration because a part of the carrier generated by the donor-type impurity is captured by the acceptor-type defect. The reduction of the carrier concentration by compensation, corresponds to the concentration of the mixed acceptor-type defect. Namely, the carrier concentration corresponds to the concentration of the donor-type impurity after compensation, which is the concentration after subtracting the concentration of the acceptor-type defect from the concentration of the donor-type impurity.

An acceptor-type impurity and an acceptor-type specific defect are known as the acceptor-type defect.

The acceptor-type impurity is an unintended impurity, which is the impurity inevitably mixed into a crystal when the n-type group III nitride semiconductor is crystal-grown. The carrier concentration is reduced by the acceptor-type impurity which compensates the doped donor-type impurity. For example, carbon (C), etc., is given as the acceptor-type impurity, wherein the carbon is derived from trimethylgallium $((CH_3)_3Ga)$ which is a Ga source used for forming the GaN semiconductor for example (for example, see non-patent document 1).

The acceptor-type specific defect is one kind of a lattice defect in a crystal structure of the group III nitride semiconductor, and is generated by lack of Ga, etc., in the GaN semiconductor. The carrier concentration is reduced by the acceptor-type specific defect by compensating the donor-type impurity.

In manufacturing the n-type group III nitride semiconductor, the carrier concentration is controlled by suitably selecting the donor-type impurity in consideration of the reduction of the carrier concentration due to compensation of the acceptor-type defect.

[Non-patent document 1] J. Cryst. Growth, 298,871 (S. Hashimoto et al. 2007)

As described above, in order to obtain the high breakdown voltage and the low on-resistance in the n-type group III nitride semiconductor, the carrier concentration is required to be reduced to $1.0E+16 \text{ cm}^{-3}$ or less for example. In order to reduce the carrier concentration, it can be considered that an addition amount of the donor-type impurity is reduced, which generates the carrier, and the concentration thereof is reduced.

However, it is difficult to realize the low carrier concentration even in a case of the low concentration of the donor-type impurity when manufacturing the n-type group III nitride semiconductor, and for example, it is difficult to obtain the n-type group III nitride semiconductor having the carrier concentration of $1.0E+15 \text{ cm}^{-3}$ or less. Further, since the low carrier concentration is hardly realized, it is difficult to obtain the n-type group III nitride semiconductor of high breakdown voltage and low on-resistance.

SUMMARY OF THE INVENTION

In view of the above-described problem, the present invention is provided, and an object of the present invention is to provide the group III nitride semiconductor crystal, the group III nitride semiconductor substrate, the group III nitride semiconductor freestanding substrate, the nitride semiconductor device, and the rectifier diode, having the low carrier concentration and high breakdown voltage, and low on-resistance.

According to an aspect of the present invention, there is provided a group III nitride semiconductor crystal containing a donor-type impurity and having a hydrogen concentration of $2.0E+16 \text{ cm}^{-3}$ or less in a crystal.

MODE FOR CARRYING OUT THE INVENTION

Prior to the description of an embodiment of the present invention, explanation is given for a control of a carrier concentration in a group III nitride semiconductor, and a knowledge obtained by inventors of the present invention.

[Control of the Carrier Concentration]

As described above, the mixed acceptor-type defect is included in the manufactured n-type group III nitride semiconductor (also called an n-type semiconductor hereafter), other than the doped donor-type impurity. The carrier concentration in the n-type semiconductor is reduced by the compensation of the acceptor-type defect. Therefore, when the n-type semiconductor is manufactured, the carrier concentration is controlled by suitably selecting the concentration of the donor-type impurity in consideration of the reduction of the carrier concentration due to the mixed acceptor-type defect.

The concentration of the donor-type impurity is determined while referring to the compensation. The concentration of the donor-type impurity after compensation is obtained by subtracting the concentration of the mixed acceptor-type defect (acceptor-type impurity and acceptor-type specific defect), from the concentration of the doped donor-type impurity. The concentration ($N_D'$) of the donor-type impurity after compensation, is expressed by the following formula (1) using concentration ($N_D$) of the donor-type impurity, concentration ($N_A$) of the acceptor-type impurity, and concentration ($N_F$) of the acceptor-type specific defect.

$$N_D'=N_D-N_A-N_F \quad (1)$$

In formula (1), the concentration $N_D'$ of the donor-type impurity after compensation, corresponds to a theoretical value of the carrier concentration in the n-type semiconductor. According to the concentration $N_D'$ of the donor-type impurity after compensation, the carrier concentration (n) which is actually obtained in the manufactured n-type semiconductor can be expected. Namely, the actually obtained carrier concentration (n) is approximated to the concentration $N_D'$ of the donor-type impurity after compensation, as shown in the following formula (2).

$$n \approx N_D'(=N_D-N_A-N_F) \quad (2)$$

When the n-type semiconductor is manufactured, the concentration $N_D'$ of the donor-type impurity after compensation, is adjusted according to a required carrier concentration n.

Control of each concentration in formula (2) is as follows.

The concentration $N_D$ of the donor-type impurity can be controlled to an arbitrary concentration by suitably varying the addition amount of the donor-type impurity to be added intentionally. The concentration $N_A$ of the acceptor-type impurity can be analyzed by SIMS (secondary ion mass analysis), and a content of the acceptor-type impurity can be controlled to a specific concentration or less by optimizing a growth condition of a semiconductor crystal. Although it is difficult to quantitatively evaluate the concentration $N_F$ of the acceptor-type specific defect, it is empirically known that the concentration $N_F$ can be controlled to a specific concentration or less by optimizing the growth condition of the semiconductor crystal. Note that the concentration $N_A$ of the acceptor-type impurity is higher than the concentration $N_F$ of the acceptor-type specific defect, and therefore has a dominant function in the compensation.

Thus, in the manufacture of the n-type semiconductor, the carrier concentration "n" in the n-type semiconductor is controlled by precisely controlling the concentrations ($N_A$ and $N_F$) of the acceptor-type defect by optimizing the growth condition, and by setting the concentration $N_D$ of the donor-type impurity based on formula (2).

[Knowledge Obtained by the Inventors of the Present Invention]

As shown in the above-mentioned formula (2), it is found that the concentration $N_D$ of the donor-type impurity is required to be low, for obtaining the low concentration of the actually obtained carrier concentration n. However, when the concentration $N_D$ of the donor-type impurity is set to be low, a specific content of the concentrations ($N_A$ and $N_F$) of the acceptor-type defect, exists with a concentration not ignored with respect to the concentration $N_D$ of the donor-type impurity, thus receiving a great influence by the compensation for the acceptor-type defect. Therefore, when the carrier concentration n is set to be low, the concentrations ($N_A$ and $N_F$) of the acceptor-type defect are required to be precisely controlled.

In view of this point, the n-type semiconductor having the low carrier concentration is manufactured by precisely controlling the concentration ($N_A$ and $N_F$) of the acceptor-type defect, and by setting the concentration $N_D$ of the donor-type impurity to be low. Specifically, the n-type semiconductor is manufactured so that the concentration $N_D'$ of the donor-type impurity after compensation is set to 1.0E+16 cm$^{-3}$, and the carrier concentration n is set to 1.0E+16 cm$^{-3}$ or less.

However, in the manufactured n-type semiconductor, there is an unexpected variation of the carrier concentration n, with respect to the concentration $N_D'$ of the donor-type impurity after compensation, although the concentrations ($N_A$ and $N_F$) for the acceptor-type defect is precisely controlled.

The following three unexpected variations of the carrier concentration n are confirmed.

(1) When the concentration $N_D'$ of the donor-type impurity after compensation is set to be low, there is a deviation between the concentration $N_D'$ of the donor-type impurity after compensation, and the carrier concentration n.

(2) Even if the concentration $N_D'$ of the donor-type impurity after compensation is tried multiple numbers of times as a specific value, there are a plurality of carrier concentrations n with respect to the value of the concentration $N_D'$, thus causing a variation to occur.

(3) Even if the concentration $N_D'$ of the donor-type impurity after compensation is set to 1.0E+15 cm$^{-3}$ or less, the carrier concentration "n" exceeds 1.0E+15 cm$^{-3}$, and the low carrier concentration cannot be realized.

According to the above-mentioned (1) to (3), when the concentration $N_D'$ of the donor-type impurity after compensation is set to $1.0E+16$ cm$^{-3}$ or less, it is found that a correlation is low between the concentration $N_D'$ of the donor-type impurity after compensation, and the carrier concentration n, and a specific carrier concentration n with respect to the concentration $N_D'$ of the donor-type impurity after compensation, cannot be obtained. Further, according to the above-mentioned (3), it is found that the low carrier concentration of $1.0E+15$ cm$^{-3}$ or less cannot be realized only by setting the concentration $N_D'$ of the donor-type impurity after compensation to be low.

It is found by the inventors of the present invention that there is a new factor of affecting the carrier concentration other than the donor-type impurity and the acceptor-type defect, because there is the variation of the carrier concentration n as shown in the above-mentioned (1) and (2) even if the acceptor-type defect is precisely controlled, and as a result of a strenuous effort regarding this factor, attention is paid to a mixed hydrogen during manufacture of the group III nitride semiconductor crystal, as the factor of affecting the carrier concentration.

Hydrogen is a component derived from a source gas, etc., and is the impurity which is inevitably mixed into the crystal when the group III nitride semiconductor crystal is crystal-grown. A part of or the whole part of the hydrogen is turned into proton in the semiconductor crystal, as an extremely easily movable substance.

Hydrogen (proton) is bonded with an ionized acceptor (negative ion) by a coulomb interaction, so that a function as the acceptor of the acceptor-type impurity is inactivated. Inactivation of the acceptor-type impurity is a so-called hydrogen passivation and hydrogen is the cause thereof. Wherein, hydrogen does not act on the donor-type impurity, although it acts on the acceptor-type impurity. This is because hydrogen and ionized donor are both positive ions, and are not bonded with each other by a coulomb repulsive force, thus not inactivating the donor-type impurity. Namely, according to the hydrogen, the acceptor-type impurity is inactivated, resulting in causing the variation of the carrier concentration to occur, and meanwhile, the donor-type impurity is not inactivated, thus not causing the variation of the carrier concentration to occur.

Since the donor-type impurity is not influenced by hydrogen, the hydrogen passivation has not been a problem heretofore in the n-type semiconductor doped with the donor-type impurity, and the hydrogen concentration is not the problem either. Originally, there is a high concentration of the donor-type impurity in a conventional n-type semiconductor, and there is an extremely low concentration of the mixed acceptor-type impurity that can be ignored. Therefore, the variation of the carrier concentration hardly occurs by the inactivation by hydrogen, and the hydrogen concentration is not the problem.

In view of this point, when the concentration of the donor-type impurity is set to be low in the n-type semiconductor, the influence by the inactivation of the acceptor-type impurity by hydrogen cannot be ignored, and therefore it is found by the inventors of the present invention that the unexpected variation of the carrier concentration occurs as described above. Namely, it can be considered that when the concentration of the donor-type impurity is set to be low, the mixed acceptor-type impurity is inactivated by hydrogen, and its effective concentration is varied, thus largely fluctuating the concentration of the donor-type impurity after compensation, resulting in the variation of the carrier concentration.

Therefore, the variation of the carrier concentration due to the difference in the hydrogen concentration, is considered by changing the hydrogen concentration in the n-type semiconductor. As a result, although a mechanism of the variation of the carrier concentration by hydrogen is unclear, it is found by the inventors of the present invention, that the variation of the carrier concentration is likely to occur when there is at least a specific concentration or more of hydrogen. It is also found that the above-mentioned (1) deviation of the carrier concentration, and the above-mentioned (2) variation of the carrier concentration, can be suppressed by reducing the hydrogen concentration in the n-type semiconductor to a specific value range. It is also found that the low carrier concentration that can be difficult conventionally can be realized by suppressing the variation shown in the above-mentioned (3). The present invention is achieved based on this knowledge.

[An Embodiment of the Present Invention]

The group III nitride semiconductor crystal, the group III nitride semiconductor substrate, the group III nitride semiconductor freestanding substrate and the rectifier diode according to an embodiment of the present invention, will be described hereafter.

(Group III Nitride Semiconductor Crystal)

The group III nitride semiconductor crystal of this embodiment has a content of the donor-type impurity, and has a hydrogen concentration of $2.0E+16$ cm$^{-3}$ or less in the crystal. Preferably, the hydrogen concentration is $5.0E+15$ cm$^{-3}$ or less. When the hydrogen concentration is within the above-mentioned value range, the carrier concentration is $1.0E+15$ cm$^{-3}$ or less, or $1.2E+14$ cm$^{-3}$ or more and $1.0E+15$ cm$^{-3}$ or less in an area in which the concentration of the donor-type impurity is $1.0E+17$ cm$^{-3}$ or less.

The group III nitride semiconductor crystal of this embodiment has the specific content of donor-type impurity, and is formed as the n-type semiconductor having n-type conductivity. For example, gallium nitride (GaN) or aluminum nitride (AlN), or a nitride mixed crystal of gallium and aluminum (AlGaN), etc., can be given as the group III nitride semiconductor crystal. Further, the nitride mixed crystal of gallium and indium (InGaN), or the nitride mixed crystal of aluminum and indium (InAlN) or the nitride mixed crystal of gallium, aluminum, and indium (AlGaInN), etc., can also be given.

<Donor-Type Impurity>

The donor-type impurity is the impurity intentionally added to the group III nitride semiconductor crystal. The donor-type impurity generates free electrons as carrier, to thereby impart n-type conductivity to the group III nitride semiconductor crystal. The donor-type impurity is not particularly limited, and for example, silicon (Si) or germanium (Ge), etc., can be used.

<Hydrogen>

Hydrogen is the component derived from the source gas, etc., and is the impurity inevitably mixed into the semiconductor crystal when the group III nitride semiconductor crystal is crystal-grown. According to the above-mentioned knowledge, it can be considered that the concentration of the donor-type impurity after compensation is varied due to the inactivation of the acceptor-type impurity by hydrogen.

Hydrogen of low concentration is mixed into the group III nitride semiconductor crystal of this embodiment, wherein the hydrogen concentration is $2.0E+16$ cm$^{-3}$ or less, and preferably $5.0E+15$ cm$^{-3}$ or less. When the hydrogen concentration is within the above-mentioned value range, deviation between the concentration of the donor-type impurity after compensation and the carrier concentration, and the variation of the carrier concentration, can be suppressed. Further, the low carrier concentration of $1.0E+15$ cm$^{-3}$ or less which is difficult conventionally, can be realized.

<Influence of the Hydrogen Concentration on the Carrier Concentration>

Here, specific explanation is given for the influence of the hydrogen concentration on the carrier concentration, in consideration of a relation between the concentration of the donor-type impurity after compensation and an actually obtained carrier concentration, and a relation between the concentration of the donor-type impurity after compensation and the hydrogen concentration.

Figure 5:
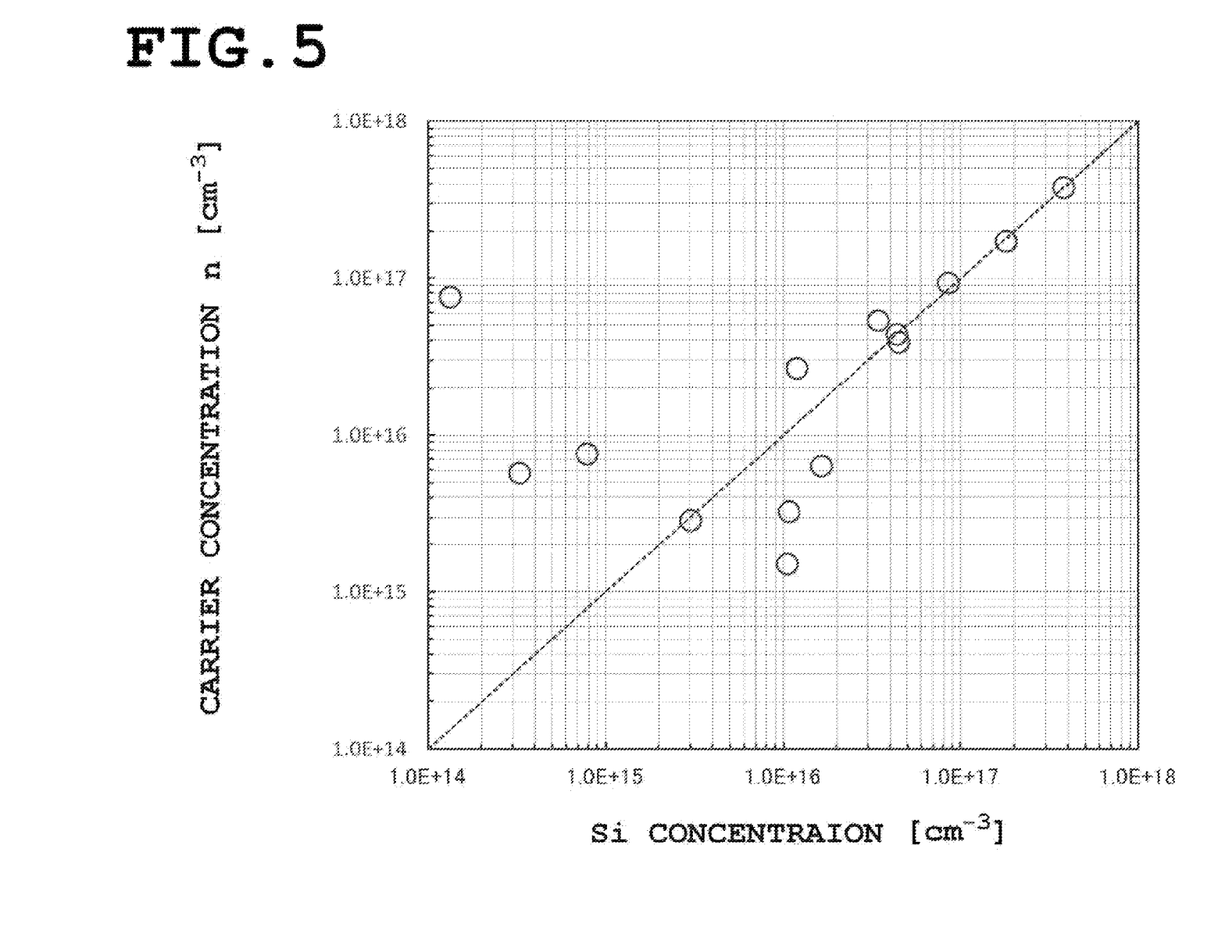
FIG. 5 is a view showing the relation between the Si concentration and the carrier concentration in the n-type GaN layer of comparative example 1.

First, in the conventional n-type semiconductor, explanation is given for the relation between the concentration of the donor-type impurity after compensation and the actually obtained carrier concentration, with reference to FIG. 5. FIG. 5 is a view showing the relation between the Si concentration and the carrier concentration in the n-type GaN layer of comparative example 1 described later. FIG. 5 shows the variation of the carrier concentration in the case of varying the Si concentration, using Si as the donor-type impurity. In FIG. 5, the horizontal axis indicates the Si concentration, and the vertical axis indicates the carrier concentration with respect to a specific Si concentration. Further, dot line in FIG. 5 indicates a line in a proportional relation of 1:1 of the Si concentration and the carrier concentration. As a plot is closer to the dot line, the correlation between the Si concentration and the carrier concentration is high, and as the plot is deviated from the dot line, the Si concentration and the carrier concentration are deviated from each other, thus showing a low correlation.

Note that the variation of the carrier concentration is taken into consideration in association with the concentration of the donor-type impurity after compensation. However, in FIG. 5, the variation of the carrier concentration is taken into consideration in association with the concentration of the donor-type impurity (Si concentration). This is because the concentration of the acceptor-type defect is suppressed to be lower than a detection lower limit by controlling the growth condition, so that the Si concentration substantially corresponds to the concentration of the donor-type impurity after compensation.

In FIG. 5, the plot exists on the dot line when the Si concentration is higher than $1.0E+17$ cm$^{-3}$, and the Si concentration and the carrier concentration are approximately the same. Namely, it is found that the specific carrier concentration with respect to the Si concentration is obtained, and the deviation and the variation of the carrier concentration are low. This is because when the Si concentration is relatively high, the influence on the carrier concentration by the compensation for the acceptor-type impurity is low, and the deviation between the Si concentration and the carrier concentration and the variation of the carrier concentration can be suppressed.

When the Si concentration is $1.0E+17$ cm$^{-3}$ or less, the plot is deviated from the dot line, and the correlation is low between the Si concentration and the carrier concentration, thus causing the deviation of the carrier concentration to occur as shown in the above-mentioned (1). Further, even if the Si concentration is approximately the same, the obtained carrier concentration is different, thus causing the variation of the carrier concentration to occur as shown in the above-mentioned (2). It is also found that as the Si concentration is lower, the deviation and the variation of the carrier concentration are high. This is because when the concentration of Si is set to be low, there is a large influence on the carrier concentration by the compensation for the acceptor-type impurity, and there is also a large influence of the variation in the concentration of the acceptor-type impurity by hydrogen passivation.

When the Si concentration is $1.0E+15$ cm$^{-3}$ or less, the carrier concentration is expected to be $1.0E+15$ cm$^{-3}$ or less. However, the actually obtained carrier concentration is the value higher than $1.0E+15$ cm$^{-3}$. Namely, as shown in the above-mentioned (3), the carrier concentration of $1.0E+15$ cm$^{-3}$ or less cannot be obtained even if the Si concentration is reduced.

Thus, when the Si concentration in the semiconductor is reduced, the unexpected variation of the carrier concentration occurs as shown in the above-mentioned (1) to (3).

Figure 6:
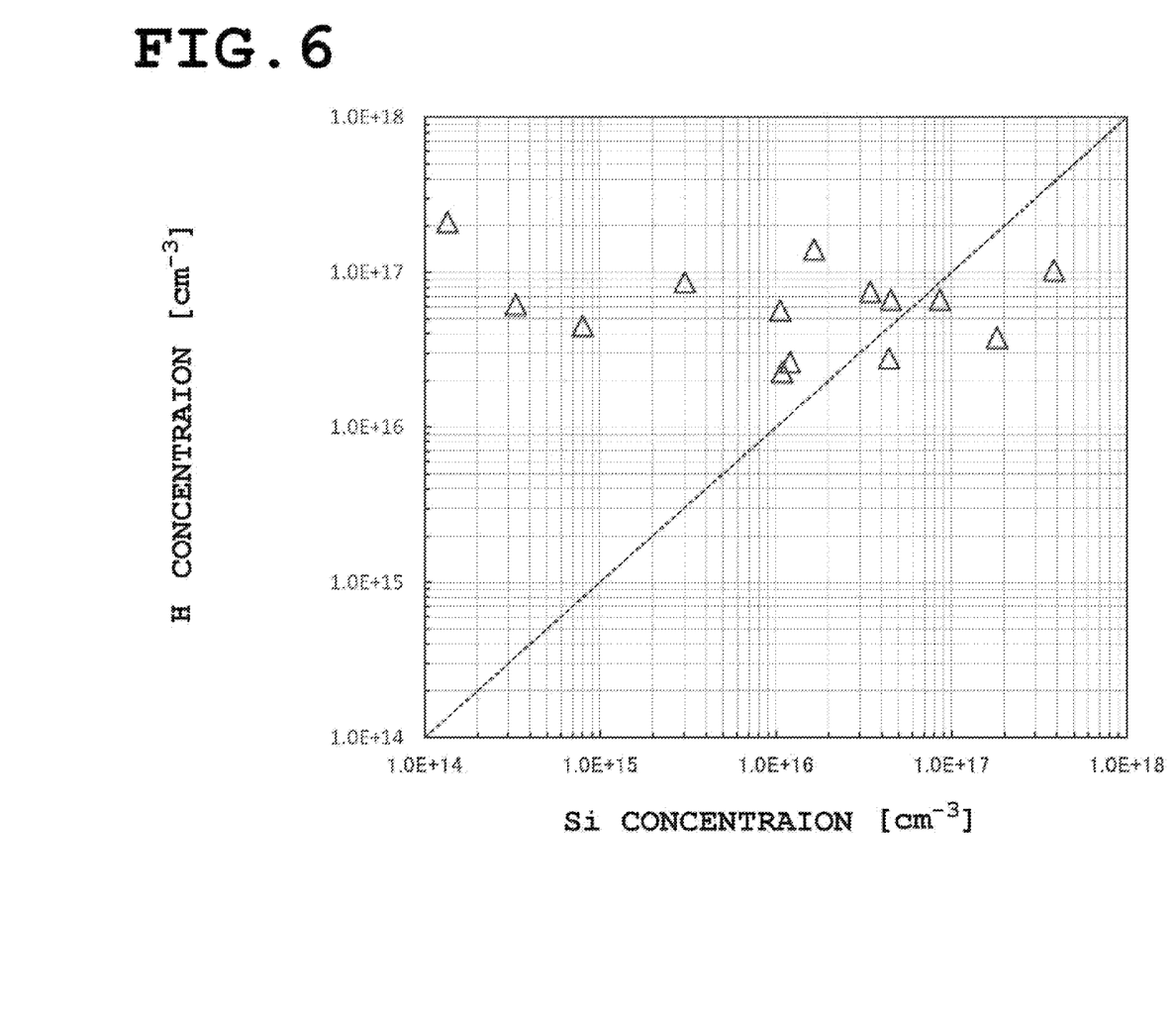
FIG. 6 is a view showing the relation between the Si concentration and the hydrogen concentration in the n-type GaN layer of comparative example 1.

Subsequently, explanation is given for the relation between the concentration of the donor-type impurity after compensation and the hydrogen concentration in the conventional n-type GaN semiconductor, with reference to FIG. 6. FIG. 6 is a view showing the relation between the Si concentration and the hydrogen concentration in the n-type GaN layer of comparative example 1 described later. In FIG. 6, the horizontal axis indicates the Si concentration, and the vertical axis indicates the hydrogen concentration (H-concentration in the figure). Further, the dot line in FIG. 6 indicates the line where the Si concentration and the hydrogen concentration are the same. When the plot exists in the area above the dot line, this shows that the hydrogen concentration is higher than the Si concentration, and meanwhile, when the plot exits in the area below the dot line, this shows that the hydrogen concentration is lower than the Si concentration.

According to FIG. 6, it is found that the conventional n-type GaN semiconductor contains approximately a specific content of hydrogen, irrespective of the Si concentration. The hydrogen concentration is higher than $2.0E+16$ cm$^{-3}$, and in a range of $2.27E+16$ cm$^{-3}$ or more and $2.0E+17$ cm$^{-3}$ or less. When the Si concentration is reduced in the GaN semiconductor containing approximately a constant ratio of hydrogen, the ratio of hydrogen is relatively increased with a decrease of the ratio of Si occupying the impurities in the crystal. When the Si concentration is $1.0E+17$ cm$^{-3}$ or less, the ratio of hydrogen is higher than the ratio of Si. Then, when the Si concentration is $1.0E+15$ cm$^{-3}$ or less, 1000 times or more of hydrogen exits with respect to Si.

According to FIG. 5 and FIG. 6, the variation of the carrier concentration occurs when the Si concentration is low and the ratio of hydrogen is high. Therefore, it can be considered that the carrier concentration is influenced by hydrogen, thus causing the unexpected variation of the carrier concentration to occur.

Further, since the unexpected variation of the carrier concentration occurs with a reduction of the Si concentration and an increase of the ratio of hydrogen, it can be considered that the deviation and the variation of the carrier concentration are influenced by the ratio of hydrogen with respect to Si. Particularly, when the Si concentration is $1.0E+15$ cm$^{-3}$ or less, the ratio of hydrogen is 1000 times or more of the ratio of Si, and it can be considered that the unexpected variation of the carrier concentration occurs by higher ratio of hydrogen than the ratio of Si.

Figure 1:
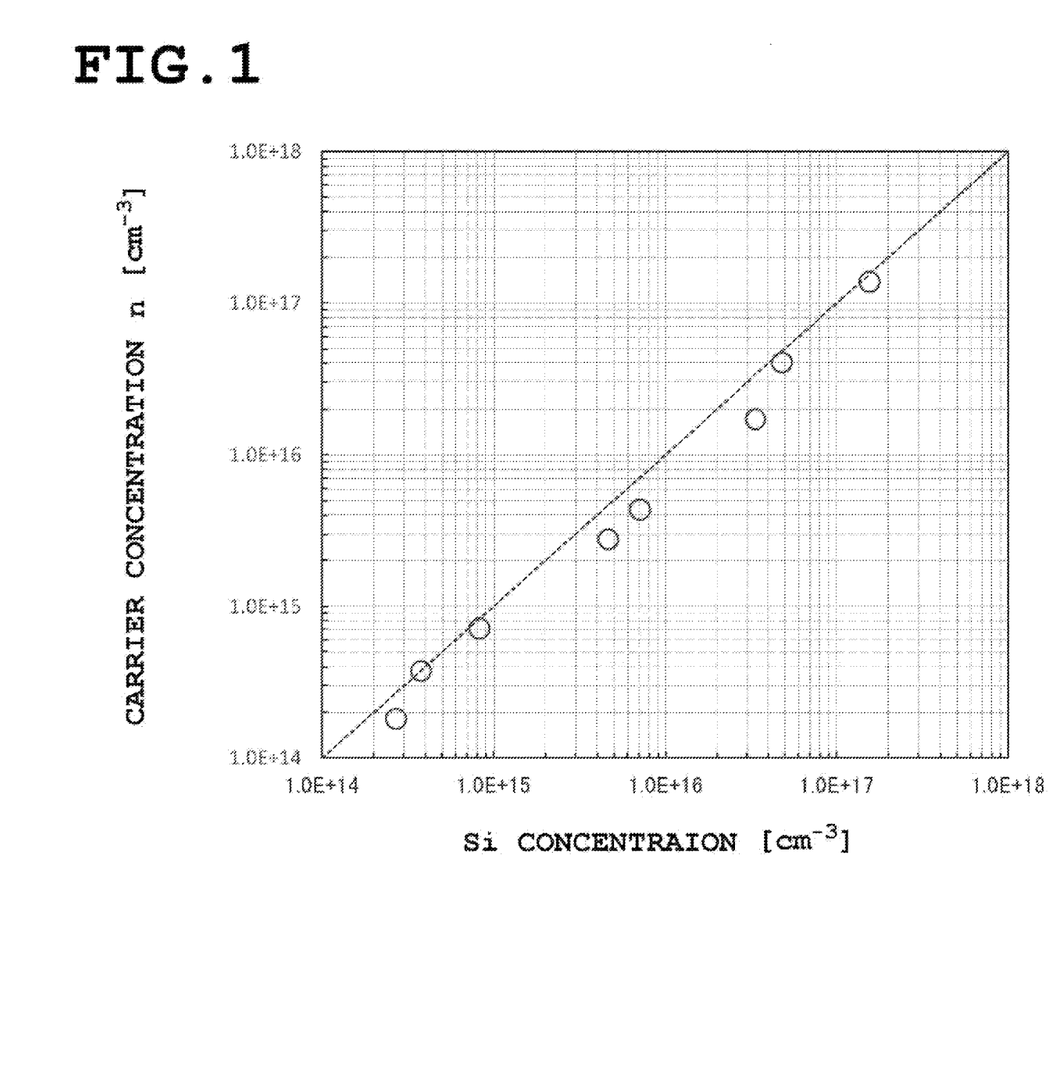
FIG. 1 is a view showing a relation between a Si concentration and a carrier concentration in an n-type GaN layer of example 1.
Figure 2:
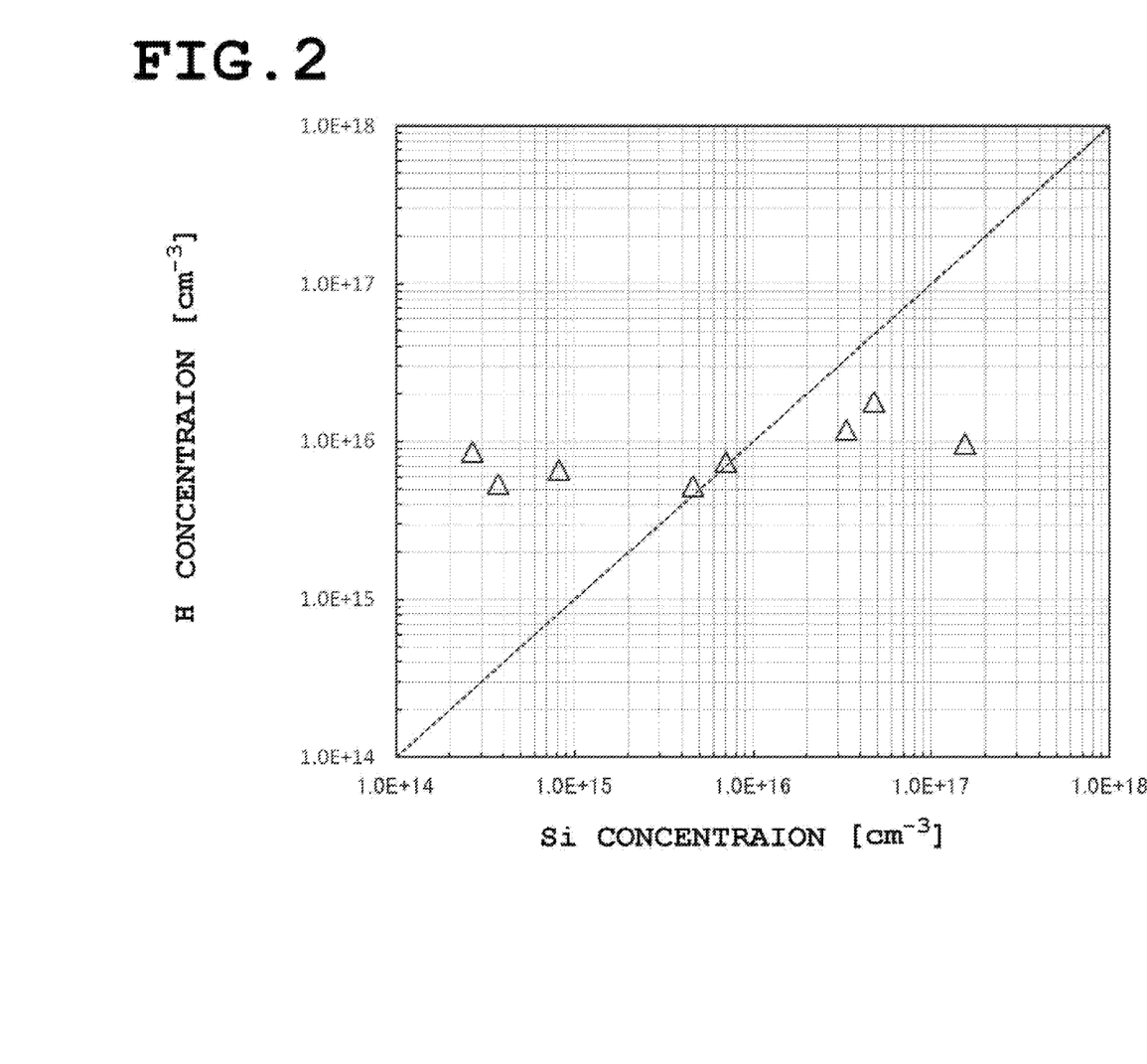
FIG. 2 is a view showing the relation between the Si concentration and a hydrogen concentration in the n-type GaN layer of example 1.
Figure 3:
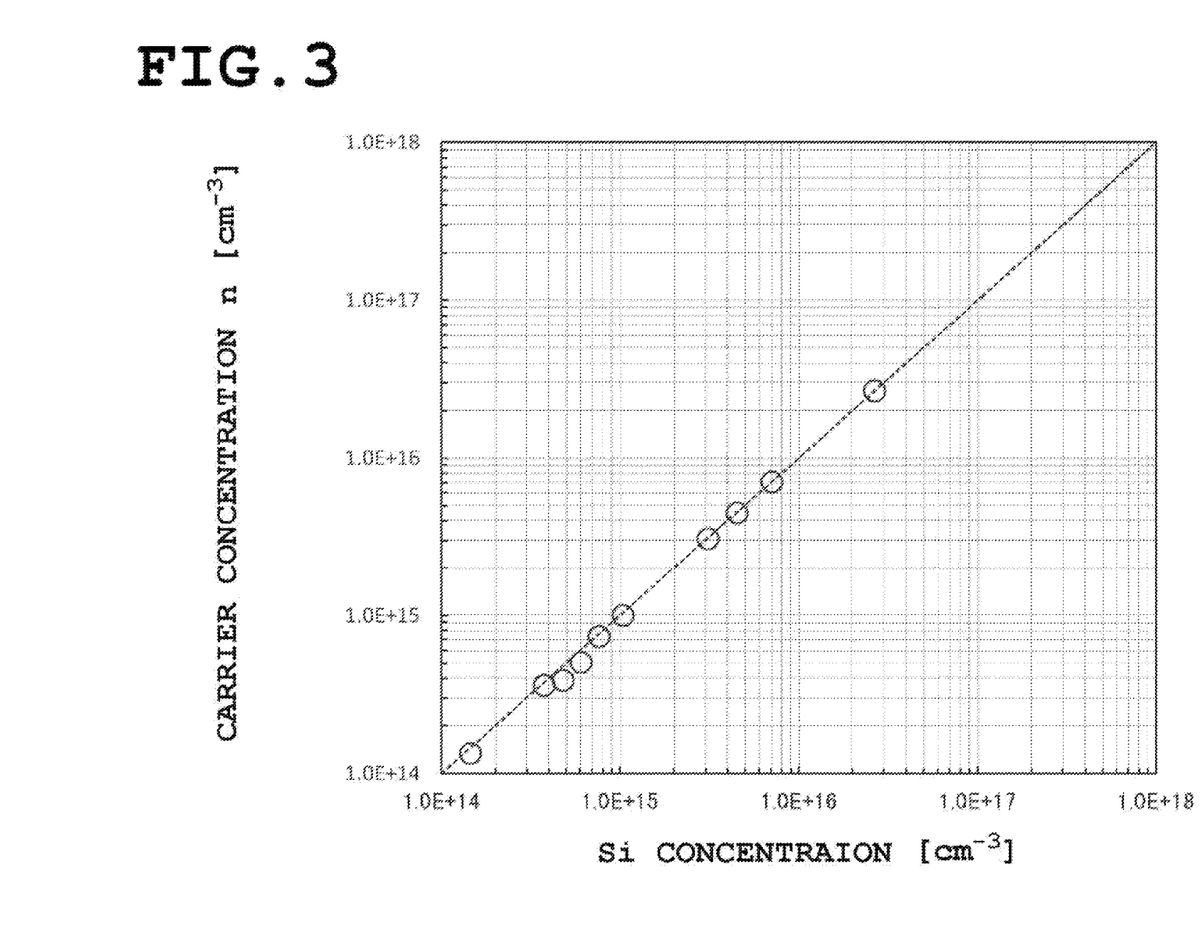
FIG. 3 is a view showing the relation between the Si concentration and the carrier concentration in the n-type GaN layer of example 2.
Figure 4:
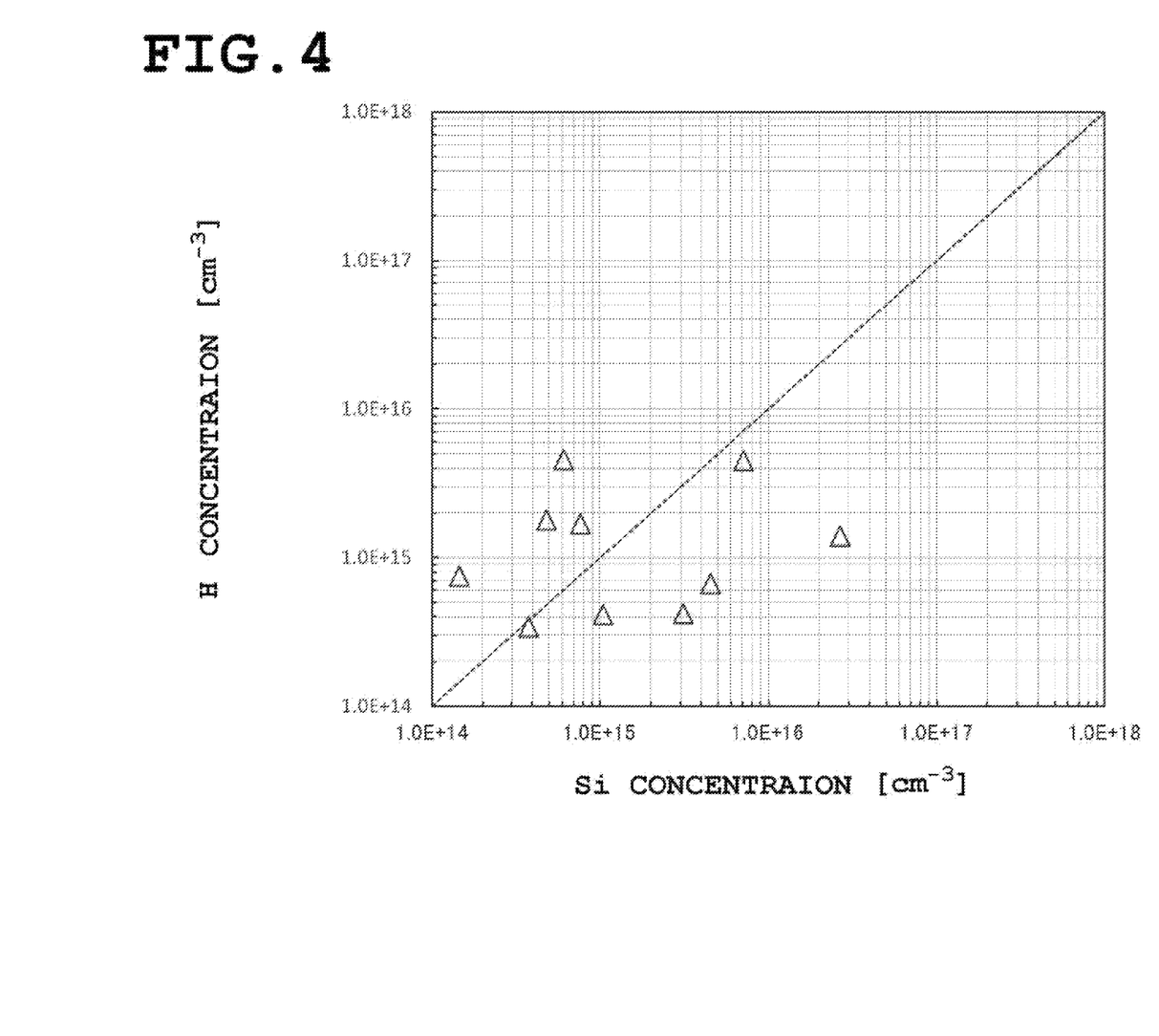
FIG. 4 is a view showing the relation between the Si concentration and the hydrogen concentration in the n-type GaN layer of example 2.

Meanwhile, in this embodiment, even when the Si concentration is set to be low, the hydrogen concentration is set to $2.0E+16$ cm$^{-3}$ or less as a low concentration, to reduce the influence of the hydrogen on the carrier concentration by suppressing the increase of the ratio of hydrogen with respect to Si. Here, explanation is specifically given for a difference in the influence on the carrier concentration by the hydrogen concentration, with reference to FIG. 1 to FIG. 4. FIG. 1 is a view showing the relation between the Si concentration and the carrier concentration in the n-type GaN layer of example 1, and FIG. 2 is a view showing the relation between the Si concentration and the hydrogen concentration in the n-type GaN layer of example 1. Further, FIG. 3 is a view showing the relation between the Si concentration and the carrier concentration in the n-type GaN layer of example 2, and FIG. 4 is a view showing the relation between the Si concentration and the hydrogen concentration in the n-type GaN layer of example 2.

As shown in FIG. 2, approximately the constant ratio of hydrogen is contained in the n-type GaN layer of example 1, irrespective of the Si concentration, wherein the hydrogen concentration is 2.0E+16 cm$^{-3}$ or less. According to FIG. 2, by reducing the hydrogen concentration, the increase of the ratio of hydrogen can be suppressed in the semiconductor crystal in which the concentration of Si is low. By suppressing the increase of the ratio of hydrogen, the influence on the carrier concentration by hydrogen can be suppressed, and the semiconductor crystal with less deviation of the Si concentration and the carrier concentration, and less variation of the carrier concentration as shown in FIG. 1, can be obtained. Namely, when the hydrogen concentration is within the specific value range in the semiconductor crystal, the correlation between the Si concentration and the carrier concentration is high.

Further, according to FIG. 1, when the hydrogen in the crystal is the specific concentration or less, a specific carrier concentration with respect to a specific Si concentration, can be obtained, with a high correlation between the Si concentration and the carrier concentration. Namely, the semiconductor crystal in which the Si concentration and the carrier concentration are set in the specific proportional relation, can be obtained. In the case of containing Si as the donor-type impurity, the Si concentration and the carrier concentration are set in the proportional relation of about 1:1 as shown in FIG. 1. A height of the correlation is expressed by a deviation degree γ calculated using the concentration $N_D$ of the donor-type impurity and the carrier concentration n.

$$\gamma = |n - N_D|/n \quad (3)$$

The above-mentioned formula (3) shows that the correlation between the concentration of the donor-type impurity and the carrier concentration is high as γ is close to 0. Reversely, formula (3) also shows that the correlation between the concentration of the donor-type impurity and the carrier concentration is low as γ is larger, wherein the correlation is high when γ is 0.3 or more and 1 or less, and the correlation is further high when γ is 0 or more and 0.3 or less.

In this embodiment, deviation degree γ calculated by the above-mentioned formula (2) is in the range of 0 to 1 when the Si concentration is 1.0E+17 cm$^{-3}$ or less. Therefore, the correlation is high and the carrier concentration can be precisely controlled. Note that as shown in FIG. 1, according to this embodiment, the correlation between the Si concentration and the carrier concentration is high even in the case of a relatively high Si concentration, and the concentration is not limited to the Si concentration.

Further, according to FIG. 1, when the concentration of hydrogen in the crystal is a specific value or less, the low carrier concentration of 1.0E+15 cm$^{-3}$ or less which is difficult conventionally, can be realized, by suppressing the influence on the carrier concentration by hydrogen. Further, the low carrier concentration of 1.2E+14 cm$^{-3}$ or more and 1.0E+15 cm$^{-3}$ or less can be realized. As a result, the semiconductor crystal with high breakdown voltage and low on-resistance can be obtained.

Further, the hydrogen concentration in the crystal is preferably 5.0E+15 cm$^{-3}$ or less. As shown in FIG. 4, the increase of the ratio of hydrogen in the semiconductor crystal with low concentration of Si can be further suppressed by further reducing the hydrogen concentration in the crystal, and the influence on the carrier concentration by hydrogen can be further reduced. Then, as shown in FIG. 3, the correlation between the Si concentration and the carrier concentration can be further improved and the semiconductor crystal with further less deviation and variation of the carrier concentration, can be obtained.

<Carrier Concentration>

The carrier concentration is determined by the concentration of the donor-type impurity after compensation for the acceptor-type defect. In this embodiment, since the correlation between the concentration of the donor-type impurity after compensation and the carrier concentration is high, the specific carrier concentration can be obtained by precisely controlling the concentration of the donor-type impurity after compensation. The carrier concentration is suitably varied, because its required value is different depending on the n-type semiconductor. For example, in the n-type semiconductor in which high breakdown voltage and low on-resistance can be obtained, the carrier concentration is preferably 1.0E+15 cm$^{-3}$ or less or 1.2E+14 cm$^{-3}$ or more and 1.0E+15 cm$^{-3}$ or less. In this embodiment, when the hydrogen concentration is 2.0E+16 cm$^{-3}$ or less or preferably 5.0E+15 cm$^{-3}$ or less, the above-mentioned low carrier concentration can be realized when the concentration of the donor-type impurity is 1.0E+17 cm$^{-3}$ or less.

The concentration of the donor-type impurity after compensation is determined by the above-mentioned formula (1). In formula (1), the concentration (addition amount) of the donor-type impurity is suitably varied in consideration of a desired carrier concentration and the concentration of the acceptor-type defect. A mixture amount (concentration) of the acceptor-type impurity is controlled by a growth method and a growth condition of the crystal. However, the concentration is preferably about 5.0E+13 cm$^{-3}$ or less. Further, although it is difficult to quantitatively evaluate the acceptor-type specific defect, it is empirically known that the concentration of the acceptor-type specific defect is about 3.0E+13 cm$^{-3}$, due to the reduction of the concentration of the donor-type impurity by compensation.

(Group III Nitride Semiconductor Substrate)

Figure 7:
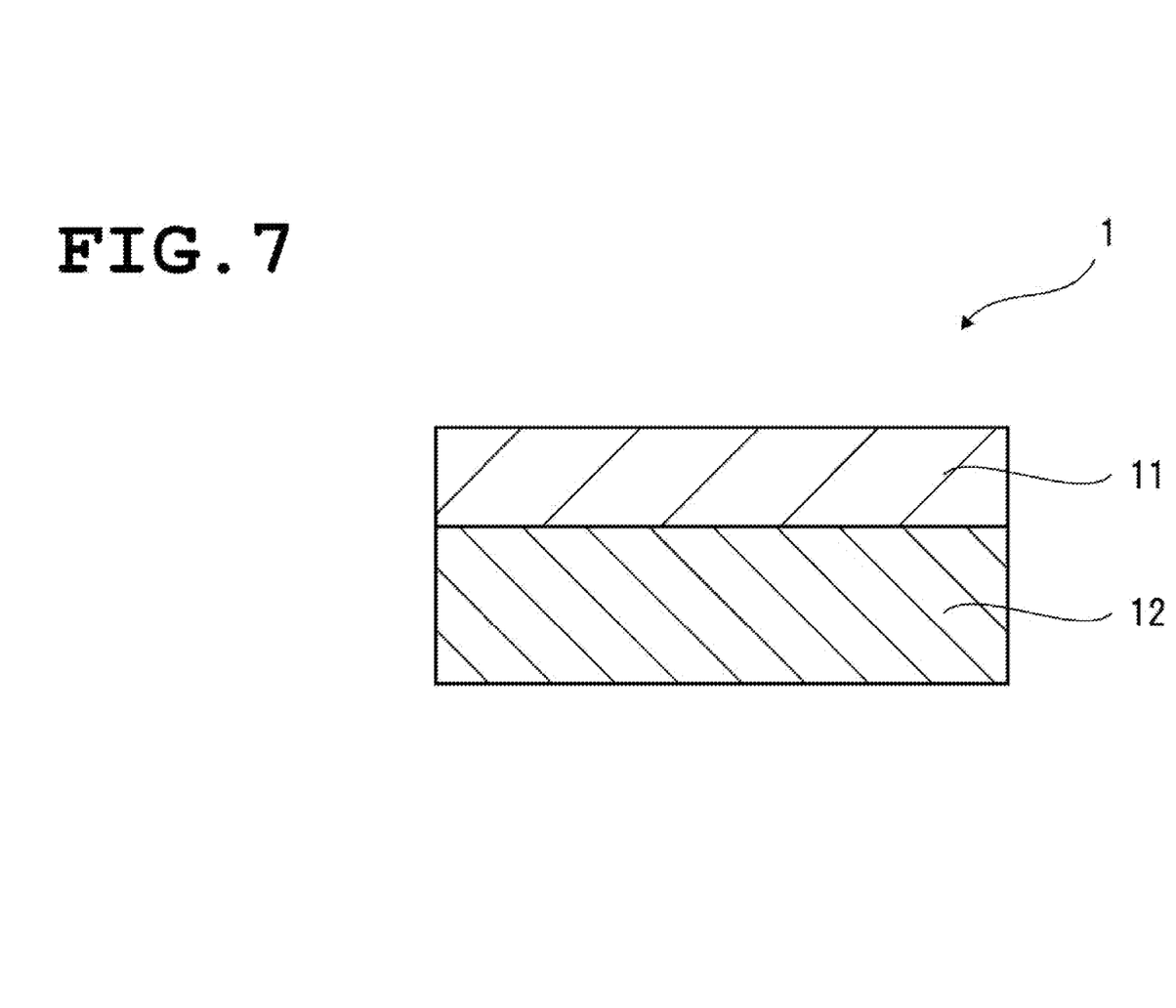
FIG. 7 is a view showing a sectional surface of the group III nitride semiconductor substrate according to an embodiment of the present invention.

For example as shown in FIG. 7, the group III nitride semiconductor substrate 1 according to an embodiment of the present invention, includes an epitaxial layer 11 on the substrate 12, which is the layer composed of the above-mentioned group III nitride semiconductor crystal.

A heterogeneous substrate such as a sapphire substrate and a silicon substrate, or a homogeneous substrate such as a GaN substrate, etc., is used as the substrate 12. However, the homogenous substrate is preferably used. This is because the substrate is required to be removed before a rear surface electrode is formed, when an insulating substrate is used for example as the heterogeneous substrate, or when the electrode is formed on an upper surface of the substrate, an occupying area is increased, resulting in the increase of a cost and the increase of a size of a chip. In the homogeneous substrate, there is less generation of the crystal defect owing to homoepitaxial growth, and a flat epitaxial growth surface can be easily obtained. For example, a gallium nitride freestanding substrate can be used as the homogeneous substrate. Further, the n-type substrate with low dislocation density is preferably used as the substrate 12. By using the substrate with low dislocation density, the breakdown voltage characteristic can be improved by suppressing the crystal defect (such as dislocation) in the epitaxial layer. Although a plane orientation of the substrate is not limited, C-plane is preferable.

The epitaxial layer 11 is composed of the above-mentioned group III nitride semiconductor crystal, which is formed as the n-type semiconductor having a specific hydrogen concentration, in which the correlation between the concentration of the donor-type impurity after compensation and the carrier concentration is high.

(Group III Nitride Semiconductor Freestanding Substrate)

The group III nitride semiconductor freestanding substrate (freestanding substrate) according to an embodiment of the present invention, is composed of the above-mentioned group III nitride semiconductor crystal. The freestanding substrate is the substrate capable of maintaining its own shape, and having a strength of not allowing inconvenience to occur in handling. The freestanding substrate is composed of the above-mentioned group III nitride semiconductor crystal, and is formed as the n-type semiconductor having the specific hydrogen concentration, in which the correlation between the concentration of the donor-type impurity after compensation and the carrier concentration is high. Although the thickness of the freestanding substrate is not particularly limited, the thickness is preferably set to 250 μm or more.

(Rectifier Diode)

Figure 8:
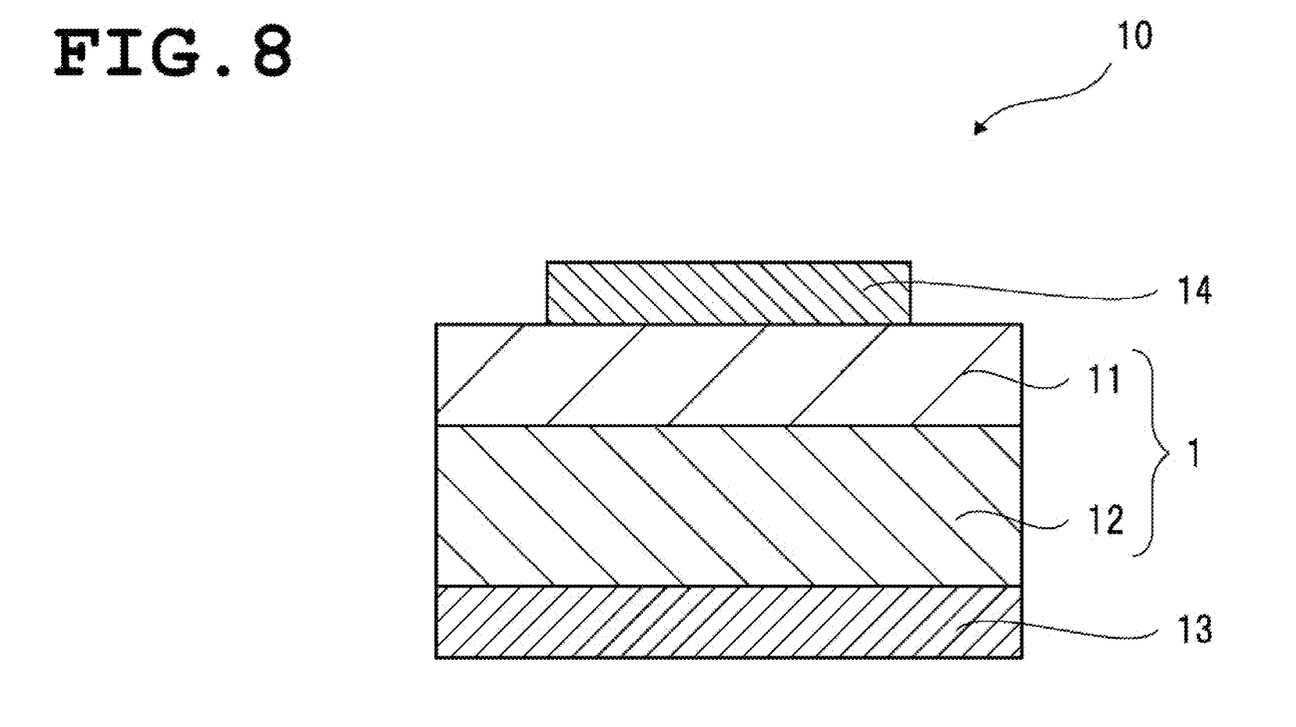
FIG. 8 is a view showing the sectional surface of a rectifier diode according to an embodiment of the present invention.

Next, explanation is given for a nitride semiconductor device including the above-mentioned group III nitride semiconductor substrate. In this embodiment, a rectifier diode is described as the nitride semiconductor device. FIG. 8 is a view showing the sectional surface of the rectifier diode according to an embodiment of the present invention.

As shown in FIG. 8, a rectifier diode 10 of this embodiment includes a group III nitride semiconductor substrate 1 in which the epitaxial layer 11 composed of the group III nitride semiconductor crystal is formed on the substrate 12, and an ohmic electrode 13 provided on an opposite side of the surface on which the epitaxial layer 11 of the substrate 12 is formed so as to be in ohmic-contact with the substrate 12, and a shottky electrode 14 provided on the opposite side of the surface on which the substrate 12 of the epitaxial layer 11 is formed.

The ohmic electrode 13 and the shottky electrode 14 are formed by photolithography or a vacuum deposition, etc. The ohmic electrode 13 is made of a metal capable of making a good ohmic-contact with the substrate 11, containing titanium (Ti) and aluminum (Al) for example. The shottky electrode 14 is made of a metal capable of making a good contact with the epitaxial layer 11, containing palladium (Pd) and gold (Au) for example.

(Method of Manufacturing the Group III Nitride Semiconductor Crystal)

A method of manufacturing the above-mentioned group III nitride semiconductor crystal will be described next. Explanation is given hereafter for a case that the epitaxial layer formed on the substrate is formed as the group III nitride semiconductor crystal.

The group III nitride semiconductor crystal can be crystal-grown by a publicly-known method such as Metal Organic Chemical Vapor Deposition (MOVPE method), Hydride Vapor Phase Epitaxy (HVPE method), or Molecular Beam Epitaxy (MBE method), etc. For example, when the gallium nitride crystal is grown as the group III nitride semiconductor crystal, a gallium raw material and a nitrogen raw material are supplied to the substrate by a carrier gas, to thereby cause a crystal growth thereon.

When the crystal growth is caused by the MOVPE method or the HVPE method for forming the group III nitride semiconductor crystal, for example a hydrogen carbide compound such as an organic metal, or a hydrogen compound such as ammonia and hydrogen chloride, etc., is used as a source gas. Therefore, hydrogen derived from these source gases is mixed into the crystal. Further, in the case of the MBE method as well, hydrogen is similarly mixed by using ammonia as the source gas. Even if the source gas not containing hydrogen is used, hydrogen is sometimes generated by excitation and decomposition of a water content at a high temperature due to a catalytic effect on the semiconductor surface, in the case that the water content exists in the atmosphere in a growth furnace, with a result that the generated hydrogen is mixed into the crystal.

Therefore, according to this embodiment, in order to set the hydrogen concentration in the group III nitride semiconductor crystal in a target low concentration range, the source gas and the carrier gas, and growth conditions such as a growth temperature and a growth pressure, etc., are suitably changed.

When the gallium nitride crystal is crystal-grown by the MOVPE method, the gallium nitride crystal can be grown by supplying to the substrate trimethylgallium or triethylgallium as a gallium source, ammonia, hydrazine, or dimethylhydrazine as a nitrogen source, and monosilane as the donor-type impurity.

When the crystal growth is caused by the HVPE method, the gallium nitride crystal can be grown by supplying to the substrate a GaCl gas as the gallium source generated by supplying hydrogen chloride (HCl) to a molten gallium metal (Ga), ammonia as the nitrogen source, and monosilane or silane chloride as the donor-type impurity.

Further, hydrogen is not preferably used for suppressing the mixture of hydrogen into the crystal, or the gas not containing hydrogen is preferably used. Even if the hydrogen is used as the carrier gas, rare gas such as nitrogen and argon, etc., is mixed into the hydrogen to thereby obtain a mixed gas, and such a mixed gas is used. The rare gas does not affect the crystal growth, and therefore by using the mixed gas, the crystal growth is caused in a low partial pressure state of hydrogen, so that the increase of the hydrogen concentration in the gallium nitride crystal can be suppressed. Further, by obtaining the mixed gas by mixing the rare gas, hydrogen mixture itself can be suppressed. As the carrier gas, for example, hydrogen, nitrogen, argon, or the mixed gas in which helium, neon, and xenon are mixed into them, can be used.

As the condition of the crystal growth, preferably the growth temperature and the growth pressure for the crystal are further suitably varied, for reducing the hydrogen concentration in the crystal. The growth temperature is decreased by about 100° C. which is lower than a normal growth temperature, and for example when the ammonia gas is used, the growth temperature is set to 900° C. or more and 1200° C. or less, and when the hydrazine-based gas is used, the growth temperature is set to 600° C. or more and 1000° C. or less. If the growth temperature is low, surface flatness of the semiconductor crystal is deteriorated. Therefore, the growth temperature is preferably optimized by using the MOVPE method and the HVPE method, etc., together. Further, the growth pressure is preferably set to be high, and for example, is set to 0.2 MPa or more and 1.5 MPa or less. If the growth pressure is low, carbon that acts as the acceptor-type impurity is easily mixed, and hydrogen is also easily mixed.

Thus, by suitably changing the source gas or the carrier gas, and the growth condition, etc., for the crystal, the epitaxial layer composed of the group III nitride semiconductor crystal is formed on the substrate, and the above-mentioned group III nitride semiconductor substrate is formed.

In the above description, explanation is given for the case of forming the epitaxial layer formed on the substrate as the group III nitride semiconductor crystal. In this explanation, the crystal growth is also achieved similarly as described above, for the group III nitride semiconductor crystal constituting the group III nitride semiconductor freestanding substrate. Namely, the group III nitride semiconductor freestanding substrate is formed by causing a thick crystal growth of the group III nitride semiconductor crystal on a base substrate which is a seed crystal, and slicing the obtained thick group III nitride semiconductor crystal. Note that the base substrate on which the crystal growth is caused, is not particularly limited.

Note that no large difference in the hydrogen concentration is confirmed, which is caused by the difference of the crystal growth methods such as the MOVPE method and the HVPE method, etc.

(Effect of this Embodiment)

According to this embodiment, one or a plurality of effects described hereafter are exhibited.

According to this embodiment, the concentration of hydrogen is low, which is $2.0E+16$ $cm^{-3}$ or less, and the variation of the carrier concentration by hydrogen is suppressed. Therefore, the deviation between the concentration of the donor-type impurity after compensation and the carrier concentration is small, and the group III nitride semiconductor crystal with small variation of the carrier concentration can be obtained. Namely, the group III nitride semiconductor crystal can be obtained, in which the carrier concentration obtained by the concentration of the donor-type impurity after compensation, is precisely controlled.

Further, according to this embodiment, the influence on the hydrogen carrier concentration can be suppressed by setting the low hydrogen concentration. Therefore, the low carrier concentration of $1.0E+15$ $cm^{-3}$ or less which cannot be obtained conventionally, can be realized.

Further, according to this embodiment, the hydrogen concentration is preferably set to $5.0E+15$ $cm^{-3}$ or less. With this structure, the influence on the carrier concentration by hydrogen is further suppressed, and therefore the carrier concentration obtained by the concentration of the donor-type impurity after compensation, can be further precisely controlled.

Further, according to this embodiment, even when the concentration of the donor-type impurity is set to $1.0E+17$ $cm^{-3}$ or less, there is a high correlation between the concentration of the donor-type impurity after compensation and the carrier concentration, and the correlation is in a specific proportional relation. According to the specific proportional relation, a specific carrier concentration with respect to a specific concentration of the donor-type impurity, can be obtained.

Further, according to this embodiment, since the specific carrier concentration can be obtained depending on the concentration of the specific donor-type impurity, the group III nitride semiconductor substrate and the group III nitride semiconductor freestanding substrate with low carrier concentration, high breakdown voltage, and low on-resistance, can be obtained. Then, the nitride semiconductor device and the rectifier diode including them as the breakdown voltage layer, can be obtained.

[Other Embodiment of the Present Invention]

As described above, the embodiment of the present invention is specifically described. However, the present invention is not limited to the above-mentioned embodiment, and can be variously modified in a range not departing from the gist of the invention.

In the above-mentioned embodiment, explanation is given for the rectifier diode including the group III nitride semiconductor substrate as the nitride semiconductor device. However, the epitaxial layer or the freestanding substrate composed of the group III nitride semiconductor crystal of the present invention, can be used for a Shottky barrier diode, pn diode, or each kind of transistors.

Further, explanation is given for a case of adjusting the hydrogen concentration by suitably changing the growth condition of the crystal. However, the hydrogen concentration can also be adjusted by annealing the semiconductor crystal, so as to be a target concentration.

Owing to the annealing, the hydrogen concentration is balanced by diffusing hydrogen so that enthalpy is equalized inside/outside of a crystal surface, and therefore the hydrogen concentration in the crystal can be reduced by discharging the hydrogen mixed into the crystal, to the outside. The annealing is preferably performed in a state that a hydrogen partial pressure outside of the crystal is reduced. Namely, the annealing is preferably performed in an inert gas such as argon (Ar) or krypton (Kr), nitrogen ($N_2$), etc. Further, it is also considered to be effective to perform annealing in a gas capable of forming a stable compound with hydrogen by reaction, depending on a condition such as a temperature. As the gas capable of forming the stable compound with hydrogen by reaction, for example, ozone and nitrous oxide, etc., can be given. However, when these gases are used, the gas chemically generated by reaction with hydrogen (such as water) should not be remarkably decomposed at an annealing temperature. Therefore, attention should be paid to an equilibrium constant for a decomposing reaction. Further, ozone, etc., is an oxidizing gas, and there is a high possibility that the surface of the gallium nitride semiconductor crystal is oxidized, and therefore a sacrifice layer which easily allows hydrogen to diffuse and which does not cause a problem even if being oxidized, is preferably provided on the surface of the gallium nitride semiconductor crystal and removed after annealing.

EXAMPLE

Examples and comparative examples of the present invention will be described next.

Example 1

An Si-doped GaN as an epitaxial layer was crystal-grown to a thickness of 5 μm to 30 μm on a semi-insulating GaN freestanding substrate (Si concentration: $1.0E+19$ $cm^{-3}$, thickness: 200 μm) as the substrate, using the MOVPE method or the HVPE method or both of them, to thereby form a GaN semiconductor substrate as shown in FIG. 7. Specifically, trimethylgallium, triethylgallium, monosilane, ammonia, hydrazine, and dimethylhydrazine, were used in the MOVPE method, and Ga metal and hydrogen chloride, monosilane, silane chloride, and ammonia were used for the HVPE method, as source gases. Nitrogen, argon, or the mixed gas of mixing helium, neon, and xenon into the nitrogen and argon, was used as the carrier gas. By mixing a rare gas to obtain the mixed gas, mixture of hydrogen can be suppressed. Further, the growth pressure was controlled in the range of 0.2 MPa to 1.5 MPa, as the growth condition for the crystal. In a case of a high growth pressure, mixture of carbon that acts as the acceptor-type impurity can be suppressed, and the mixture of hydrogen can also be suppressed. Further, even in a case of using the ammonia gas, the growth temperature was controlled in the range of 900° C. to 1200° C., and in the case of using the hydrazine-based gas, the growth temperature was controlled in the range of 600° C. to 1000° C.

In example 1, GaN semiconductor substrates of samples 1 to 8 with different Si concentrations even if the hydrogen concentration was $2.0E+16$ $cm^{-3}$ or less, were formed by suitably changing the growth condition, etc., for the above-mentioned source gas and crystal. The Si concentration, the hydrogen concentration, and the carrier concentration of the obtained GaN substrate were measured by SIMS analysis and Hall measurement. Measurement results thereof are shown in table 1. Note that in this example, annealing was not performed.

TABLE 1

| | Si concentration [cm$^{-3}$] | H concentration [cm$^{-3}$] | Carrier concentration n [cm$^{-3}$] | Deviation degree γ |
|---|---|---|---|---|
| Sample 1 | 2.70E+14 | 8.70E+15 | 1.83E+14 | 0.48 |
| Sample 2 | 3.75E+14 | 5.40E+15 | 3.75E+14 | 0.00 |
| Sample 3 | 8.20E+14 | 6.70E+15 | 7.15E+14 | 0.15 |
| Sample 4 | 4.60E+15 | 5.30E+15 | 2.79E+15 | 0.65 |
| Sample 5 | 7.10E+15 | 7.50E+15 | 4.35E+15 | 0.63 |
| Sample 6 | 3.35E+16 | 1.20E+16 | 1.72E+16 | 0.95 |
| Sample 7 | 4.78E+16 | 1.80E+16 | 4.08E+16 | 0.17 |
| Sample 8 | 1.54E+17 | 9.80E+15 | 1.38E+17 | 0.11 |

Regarding the GaN semiconductor substrate obtained in example 1, FIG. 1 shows the relation between the Si concentration and the carrier concentration. Further, FIG. 2 shows the relation between the Si concentration and the hydrogen concentration. According to FIG. 1 and FIG. 2, the hydrogen concentration is set to 2.0E+16 cm$^{-3}$ or less, and it was confirmed that the variation of the carrier concentration by hydrogen could be suppressed. Further, even when the Si concentration is 1.0E+16 cm$^{-3}$ or less, the variation of the carrier concentration is suppressed, and the correlation between the Si concentration and the carrier concentration is high. Specifically, as shown in table 1, the deviation degree calculated by the above-mentioned formula (2) is 0 or more and 0.7 or less even when the Si concentration is 1.0E+16 cm$^{-3}$ or less, and it is found that the correlation is high. Further, FIG. 1 and FIG. 2 show that the carrier concentration of 1.0E+15 cm$^{-3}$ or less which is not obtained conventionally, can be realized.

In order to confirm the effectiveness of the GaN semiconductor substrate obtained in sample 3 of example 1, the Shottky barrier diode with an electrode diameter of 5 mm and having Au/Pd/n-type GaN (Si concentration: 0.8E+15 cm$^{-3}$ and thickness: 10 μm)/n$^+$-type GaN (Si concentration: 1.0E+19 cm$^{-3}$, thickness: 200 μm/Ti/Al structure, was formed. The carrier concentration of the n-type GaN layer was 7.2E+14 cm$^{-3}$. When the on-resistance and the breakdown voltage were measured, the on-resistance was about 1.0 mΩcm$^2$ to 1.2 mΩcm$^2$, and the breakdown voltage was 10 kV or more during application of 5V, and it was confirmed that both high breakdown voltage and low on-resistance could be realized.

Further, in order to confirm the effectiveness of the GaN semiconductor substrate obtained in sample 5 of example 1, the Shottky barrier diode with the electrode diameter of 5 mm and having Au/Pd/n-type GaN (Si concentration: 0.7E+16 cm$^{-3}$ and thickness: 10 μm)/n$^+$-type GaN (Si concentration: 1.0E+19 cm$^{-3}$, thickness: 200 μm/Ti/Al structure, was formed. The carrier concentration of the n-type GaN layer was 4.4E+15 cm$^{-3}$. When the on-resistance and the breakdown voltage were measured similarly to the above case, the on-resistance was about 1.0 mΩcm$^2$ to 1.2 cmΩcm$^2$, and the breakdown voltage was 10 kV or more during application of 5V, and it was confirmed that both high breakdown voltage and low on-resistance could be realized.

Further, if the hydrogen concentration is high in the above-mentioned Shottky barrier diode, there is a possibility that a hydrogen ion is dissociated and moved by a coulomb interaction caused by power supply, and the state of compensation is changed, and the concentration of the effective donor-type impurity is changed, thus also changing the device characteristic. Therefore, when a power supply test of about 100 hours was performed to the sample, a characteristic deterioration after power supply was not confirmed in the sample in which the hydrogen concentration was 2.0E+16 cm$^{-3}$ or less.

Example 2

In example 2, GaN semiconductor substrates of samples 9 to 18 with different Si concentrations were formed similarly to example 1 excluding a point that the hydrogen concentration was more reduced than example 1 and set to 5.0E+15 cm$^{-3}$ or less. Table 2 shows the Si concentration, the hydrogen concentration, and the carrier concentration of each sample as described below.

TABLE 2

| | Si concentration [cm$^{-3}$] | H concentration [cm$^{-3}$] | Carrier concentration n [cm$^{-3}$] | Deviation degree γ |
|---|---|---|---|---|
| Sample 9 | 1.45E+14 | 7.50E+14 | 1.33E+14 | 0.09 |
| Sample 10 | 3.75E+14 | 3.40E+14 | 3.61E+14 | 0.04 |
| Sample 11 | 4.78E+14 | 1.80E+15 | 3.90E+14 | 0.23 |
| Sample 12 | 6.05E+14 | 4.57E+15 | 5.07E+14 | 0.19 |
| Sample 13 | 7.60E+14 | 1.70E+15 | 7.37E+14 | 0.03 |
| Sample 14 | 1.04E+15 | 4.10E+14 | 9.94E+14 | 0.04 |
| Sample 15 | 3.10E+15 | 4.20E+14 | 3.08E+15 | 0.01 |
| Sample 16 | 4.50E+15 | 6.70E+14 | 4.49E+15 | 0.00 |
| Sample 17 | 7.10E+15 | 4.50E+15 | 7.07E+15 | 0.00 |
| Sample 18 | 2.65E+16 | 1.40E+15 | 2.65E+16 | 0.00 |

Regarding the GaN semiconductor substrate obtained in example 2, FIG. 3 shows the relation between the Si concentration and the carrier concentration. Further, FIG. 4 shows the relation between the Si concentration and the hydrogen concentration. According to FIG. 3 and FIG. 4, the hydrogen concentration was set to 5.0E+15 cm$^{-3}$ or less, and it was confirmed that the variation of the carrier concentration by hydrogen was further suppressed compared with example 1. Further, the variation of the carrier concentration was also suppressed when the Si concentration was 1.0E+16 cm$^{-3}$ or less, and it was confirmed that the correlation between the Si concentration and the carrier concentration was further good. Specifically, as shown in table 2, the deviation degree of example 2 is in the range of 0 or more and 0.3 or less, which shows that the deviation degree of example 2 is smaller than the range of the deviation degree of example 1, thus showing the high correlation. Therefore, it was confirmed that the carrier concentration was precisely controlled and the low carrier concentration of 1.0E+15 cm$^{-3}$ or less could be stably realized.

It was also confirmed that the Shottky barrier diode obtained in example 2 was capable of realizing both the high breakdown voltage and low on-resistance similarly to example 1. Further, the deterioration of the characteristic by the power supply test of about 100 hours could not be confirmed.

Example 3

In example 3, the Si-doped GaN with low concentration was grown by 30 mm on a n-type conductive GaN freestanding substrate with low dislocation density by the HVPE method, so that the hydrogen concentration was 2.0E+16 cm$^{-3}$ or less, and thereafter the Si-doped GaN of low concentration was cut and polished to thereby form the GaN freestanding substrate (thickness: 300 μm). When the obtained GaN freestanding substrate of example 3 was evaluated similarly to example 1 and example 2, it was confirmed that the correlation between the Si concentration and the carrier concentration was good. It was also confirmed that the low carrier concentration could be realized by setting the low Si concentration.

Comparative Example 1

In comparative example 1, GaN semiconductor substrates of samples 19 to 32 with different Si concentrations were formed similarly to example 1 excluding a point that the hydrogen concentration was set to be larger than $2.0E+16$ $cm^{-3}$. Table 3 shows the Si concentration, the hydrogen concentration, and the carrier concentration of each sample.

TABLE 3

|  | Si concentration [$cm^{-3}$] | H concentration [$cm^{-3}$] | Carrier concentration n [$cm^{-3}$] | Deviation degree γ |
|---|---|---|---|---|
| Sample 19 | 1.34E+14 | 2.10E+17 | 7.60E+16 | 1.00 |
| Sample 20 | 3.30E+14 | 6.20E+16 | 5.72E+15 | 0.94 |
| Sample 21 | 7.90E+14 | 4.50E+16 | 7.55E+15 | 0.90 |
| Sample 22 | 3.00E+15 | 8.70E+16 | 2.88E+16 | 0.04 |
| Sample 23 | 1.05E+16 | 5.70E+16 | 1.50E+15 | 6.00 |
| Sample 24 | 1.08E+16 | 2.27E+16 | 3.27E+15 | 2.30 |
| Sample 25 | 1.19E+16 | 2.61E+16 | 2.68E+16 | 0.56 |
| Sample 26 | 1.65E+16 | 1.40E+17 | 6.37E+15 | 1.59 |
| Sample 27 | 3.45E+16 | 7.50E+16 | 5.37E+16 | 0.36 |
| Sample 28 | 4.40E+16 | 2.80E+16 | 4.35E+16 | 0.01 |
| Sample 29 | 4.50E+16 | 6.70E+16 | 3.90E+16 | 0.15 |
| Sample 30 | 8.60E+16 | 6.70E+16 | 9.40E+16 | 0.09 |
| Sample 31 | 1.80E+17 | 3.80E+16 | 1.73E+17 | 0.04 |
| Sample 32 | 3.82E+17 | 1.04E+17 | 3.80E+17 | 0.01 |

Regarding the GaN semiconductor substrate obtained in comparative example 1, FIG. 5 shows the relation between the Si concentration and the carrier concentration. Also, FIG. 6 shows the relation between the Si concentration and the hydrogen concentration. According to FIG. 5 and FIG. 6, the hydrogen concentration was larger than $2.0E+16$ $cm^{-3}$, and therefore it was confirmed that the variation of the carrier concentration was unexpected as the Si concentration was reduced. It was also confirmed that even if the Si concentration was set to $1.0E+15$ $cm^{-3}$ or less, it is difficult to set the carrier concentration to $1.0E+15$ $cm^{-3}$ or less. According to table 3, it is found that the deviation degree showing the correlation is higher, and the correlation is low. Namely, in comparative example 1, it was confirmed as follows. Namely, it was difficult to precisely control the carrier concentration with respect to the Si concentration.

Further, in the Shottky barrier diode obtained in comparative example 1, the low carrier concentration of $1.0E+15$ $cm^{-3}$ or less could not be realized, and therefore it was difficult to achieve both the high breakdown voltage and low resistance. Further, it was also confirmed by the power supply test of about 100 hours, that the characteristic was deteriorated and the on-resistance was increased by several %.

(Preferable Aspects)

Preferable aspects of the present invention will be supplementarily described hereafter.

According to an aspect of the present invention, there is provided a group III nitride semiconductor crystal, containing a donor-type impurity and having a hydrogen concentration of $2.0E+16$ $cm^{-3}$ or less in a crystal.

Preferably, the hydrogen concentration is $5.0E+15$ $cm^{-3}$ or less.

Further preferably, a carrier concentration is $1.0E+15$ $cm^{-3}$ or less.

Further preferably, the carrier concentration is $1.2E+14$ $cm^{-3}$ or more and $1.0E+15$ $cm^{-3}$ or less.

Further preferably, the concentration of the donor-type impurity and the carrier concentration are in a proportional relation in an area in which the concentration of the donor-type impurity is $1.0E+17$ $cm^{-3}$ or less.

According to other aspect of the present invention, a group III nitride semiconductor substrate is provided, including an epitaxial layer composed of the group III nitride semiconductor crystal on a substrate.

According to further other aspect of the present invention, there is provided a group III nitride semiconductor freestanding substrate composed of the group III nitride semiconductor crystal.

According to further other aspect of the present invention, there is provided a nitride semiconductor device including an epitaxial layer or a freestanding substrate composed of the group III nitride semiconductor crystal.

According to further other aspect of the present invention, there is provided a rectifier diode including an epitaxial layer or a freestanding substrate composed of the group III nitride semiconductor crystal.

What is claimed is:

1. A group III nitride semiconductor crystal comprising a donor-type impurity, a carrier concentration of $1.0 E+15$ $cm^{-3}$ or less, and a hydrogen concentration of $2.0 E+16$ $cm^{-3}$ or less.

2. The group III nitride semiconductor crystal according to claim 1, wherein the hydrogen concentration is $5.0 E+15$ $cm^{-3}$ or less.

3. The group III nitride semiconductor crystal according to claim 1, wherein the carrier concentration is $1.2 E+14$ $cm^{-3}$ or more and $1.0 E+15$ $cm^{-3}$ or less.

4. The group III nitride semiconductor crystal according to claim 1, wherein concentration of the donor-type impurity and the carrier concentration are in a proportional relation in an area in which the concentration of the donor-type impurity is $1.0 E+17$ $cm^{-3}$ or less.

5. A group III nitride semiconductor substrate comprising an epitaxial layer including the group III nitride semiconductor crystal of claim 1 on a substrate.

6. A group III nitride semiconductor freestanding substrate comprising the group III nitride semiconductor crystal of claim 1.

7. A nitride semiconductor device comprising an epitaxial layer or a freestanding substrate including the group III nitride semiconductor crystal of claim 1.

8. A rectifier diode comprising an epitaxial layer or a freestanding substrate including the group III nitride semiconductor crystal of claim 1.

* * * * *